United States Patent [19]

Hattori et al.

[11] 4,283,482

[45] Aug. 11, 1981

[54] DRY LITHOGRAPHIC PROCESS

[75] Inventors: Shuzo Hattori; Shinzo Morita, both of Nagoya, Japan

[73] Assignee: Nihon Shinku Gijutsu Kabushiki Kaisha, Japan

[21] Appl. No.: 133,865

[22] Filed: Mar. 25, 1980

[30] Foreign Application Priority Data

Mar. 29, 1979 [JP] Japan ................................. 54-36307

[51] Int. Cl.³ .................... G03C 5/00; B44C 1/22; C03C 15/00; C03C 25/06
[52] U.S. Cl. .................... 430/296; 156/643; 156/646; 204/192 C; 204/192 E; 427/41; 427/43.1; 427/259; 430/328
[58] Field of Search ............................ 430/5, 286–288, 430/294, 296, 311, 317, 328; 427/38–41, 43.1, 259, 265, 340, 270, 385; 204/164, 192 FC, 192 E, 192 C, 159.2, 159.22; 156/643, 646, 654, 655, 659.1, 668

[56] References Cited

U.S. PATENT DOCUMENTS

| | | | |
|---|---|---|---|
| 4,187,331 | 2/1980 | Ma | 430/317 X |
| 4,201,800 | 5/1980 | Alcorn et al. | 430/5 |
| 4,226,896 | 10/1980 | Coburn | 156/643 X |

FOREIGN PATENT DOCUMENTS

49-40777  11/1974  Japan ....................................... 156/659

OTHER PUBLICATIONS

IBM Technical Disclosure Bulletin, vol. 21, No. 5, Oct. 1978, Simple Stripper of Charred Resist by J. Ahn et al., pp. 2111–2112.

*Primary Examiner*—William A. Powell
*Attorney, Agent, or Firm*—Larson and Taylor

[57] ABSTRACT

A plasma-polymerized film formed on the surface of a substrate is found to be suitable for subsequent use in electron-beam lithography and the film exposed to a beam of electrons is then developed to provide it with the predetermined pattern. These steps of plasma polymerization, electron-beam exposure and development can be consecutively carried out in vapor phase within a unified vacuum apparatus.

6 Claims, No Drawings

DRY LITHOGRAPHIC PROCESS

BACKGROUND OF THE INVENTION

This invention relates to a lithographic process for fabrication of a large scale integrated circuit by exposure to a beam of electron and more particularly to a lithographic process in vapor phase comprising formation of a plasma-polymerized photoresistive film, exposure of the film to electron beam and development of the exposed part of the film.

In recent years, there has been an increasing interest in the application of electron beam lithography to so-called "submicron fabrication" in the fabrication of highly integrated devices including integrated circuits. In this connection, many attempts have been made to develop electron-beam sensitive materials suitable for use in electron-beam lithography.

As a result of our close studies on the lithographic process by means of electron beams which can be carried out in a unified vacuum system, we have now found that the electron-beam sensitive film of a polymer, especially polymethyl methacrylate produced by so-called plasma polymerization technique can be suitably used in the lithographic process by exposure to a beam of electrons. This invention has been established by the association of the plasma polymerization and the electron-beam exposure with subsequent development by etching in vapor phase.

A main object of this invention is to provide a lithographic process by which the consecutive steps of formation of a plasma-polymerized film, exposure of the film to electron beams and development can be carried into effect in vapor phase under vacuum or reduced pressure within a unified vacuum apparatus.

Other objects and advantages of the invention will become apparent from the following descriptions.

SUMMARY OF THE INVENTION

According to this invention, there is provided a dry lithographic process comprising the consecutive steps of:

(i) introducing at least one ethylenically unsaturated monomer compound in the vapor form into a vacuum vessel where said monomer compound is, at least in part, excited in a plasma atmosphere and deposited onto the surface of a substrate located in the vacuum vessel to form a plasma-polymerized film on said substrate, (ii) exposing the film thus formed on the substrate to a controlled beam of electrons in conformity to the predetermined pattern to degrade the polymer in the exposed part of the film, and (iii) removing the degraded part of the polymer from the film by development in vapor phase etching atmosphere.

DETAILED DESCRIPTION OF THE INVENTION

In the first step of the present process, the plasma polymerization may be effected by subjecting the monomer compound itself to be polymerized to a glow discharge. However, a more convenient method is to introduce the monomer compound into the afterglow region at the downstream of a discharged inert gas since this method allows better control of various factors of the polymerization process which include the electron temperature of the discharge and the relative proportion of monomer to be excited to total monomer introduced. The inert gas which may be used in the method includes argon, helium and nitrogen, although argon is normally employed. In general, the inert gas is introduced into the vacuum vessel in such a quantity that the pressure prevailing in the vessel will be in the range from 0.5 to 1.0 Torr, which conveniently provides an operation temperature suitable for the excitation and polymerization of the monomer compound. In this embodiment, the inert gas is introduced into the vacuum vessel where an electric discharge, preferably a glow discharge is forced to take place, followed by introduction of the monomer to be polymerized.

The discharge may be ensured by application of a direct current voltage but conveniently by application of a high-frequency voltage through a high-frequency oscillator.

The ethylenically unsaturated monomer compounds to be used for the polymerization in this invention includes $\alpha$-olefins containing 2 to 4 carbon atoms, for example, ethylene or propylene and vinylic compounds, notably vinylic carboxylic acids and esters thereof, for example, acrylic or methacrylic acid and lower alkyl esters thereof, particularly methyl esters. These monomers may be used alone or in admixture with each other. A preferred monomer is ethylene and particularly methyl methacrylate or a mixture of these two.

The terms "polymerization" and "polymer" used herein include "copolymerization" and "copolymer", respectively.

The monomer compound is, at least in part, excited in a plasma atmosphere by the discharge to form radicals derived from the compound, which upon deposition on the surface of a substrate will act as polymerization initiator to cause the polymerization of the neat monomer film already deposited on the surface, with the result of formation thereon of a so called plasma-polymerized (or -copolymerized) film.

A duration of the exposure of the substrate to plasma atmosphere to be required for the film formation may be generally about 10 to 15 minutes.

The film thus formed will generally have a thickness from 0.2 to 1.5 $\mu$m, depending upon the nature of the monomer used and the discharge conditions.

The substrate on which the film is to be deposited may be any known one being conventionally used in the art. A typical example of the substrate is a glass plate carrying a chromium coating on the surface thereof.

The plasma-polymerization technique employed in the present invention has an advantage in that it enables the one-stage formation of a more rigid polymer film with a higher degree of polymerization as compared with the known method in which a monomer film is formed on a substrate, for example, by vacuum deposition and then transformed into the polymer film by irradiation with ultraviolet light. Thus, the polymer film produced according to the present invention is useful as electron-beam sensitive film for subsequent exposure to electron beams.

In the second step of the present process, the polymer film on the substrate is exposed to a beam of electrons controlled with a pattern-generating scheme in conformity to the predetermined pattern which has been memorized by an electronic computer. The exposure may be effected, for example, at an acceleration voltage of 5 to 25 KV using a conventional electron-beam depicting apparatus. In this way, the polymer film undergoes degradation (or depolymerization) in those parts of the film which were exposed to the electron beams. The exposed parts are to be removed from the film, by subsequent development in vapor phase.

The development (or vapor phase etching) treatment in the third step is carried out within the same vacuum vessel, preferably in an atmosphere of a corrosive metastable gas resulted from, for example, carbon tetrachloride and also in the discharge condition (the technique may be referred to as "plasma etching"). In this preferred embodiment, the pressure of the discharged gas may be in the range about $1 \times 10^{-3}$ to $1 \times 10^{-2}$ Torr, at which the development may be continued for a discharge period of 5 to 30 minutes.

Alternatively, the development may be effected, in the absence of a corrosion gas, by elevating the temperature in the vessel to such a level that said degraded parts of the polymer film will be evaporated off. The level of the temperature will, of course, depend on the nature of the polymer used and the pressure prevailing in the vacuum vessel, although it may be of ambient temperature when polymethyl methacrylate is used as the polymer film or of an elevated temperature, for example, with polyethylene.

The removal of the degraded parts exposed to the electron beam from the polymer film by the etching treatment results in formation of the polymer film carrying the predetermined pattern on the substrate.

Accordingly, this invention enables the sequent steps of the electron-beam lithographic process to be carried into effect within one unified vacuum apparatus. The apparatus may be of the type comprising one vacuum vessel which is divided by partition walls into three compartments adapted to be individually evacuated and in which there is provided a movable substrate-supporting member, for example, a conveyor belt which carrys the substrate successively from the first compartment to the second and then the third compartments. Using the apparatus of this type, the first step of the present process is carried out in the first compartment, then the substrate after evacuating the first compartment to expel therefrom the residual monomer vapors is transferred by means of the movable supporting member (or substrate holder) into the second compartment where the second step of the process is carried out, and finally the substrate is conducted through the supporting member to the third compartment in which the third step is put into practice.

This invention is further illustrated but in no way limited by the following Examples.

EXAMPLE 1

In the first step, methyl methacrylate monomer in the vapor form was introduced at a flow of 100 N cm$^3$/min. into a 50 l vacuum vessel of bell jar type where there was located a glass substrate (50×50 mm) on the surface of which a coating of chromium metal had been applied at a thickness of 0.07 μm by conventional vacuum deposition. The partial pressure of the monomer vapors in the vessel was 0.5 Torr. An electric current with a discharge frequency of 5 KHz was passed at a current density of 0.5 mA/cm$^2$ through a high-frequency oscillator to cause a glow discharge within the spacing of the vacuum vessel. After a discharge duration of 10 minutes a film of polymethyl metharylate (PMMA) was formed at a thickness of 0.3 μm on the substrate.

In the second step, the PMMA film on the substrate was exposed to a beam of electrons having a beam diameter of 0.5 μm at an acceleration voltage of 20 KV using an electron-beam depicting apparatus (ERE-301 Type manufactured by Elionix Co., Japan), whereby the predetermined pattern was depicted in the following manner: 25 beam fluxes were depicted in the square area of 0.5×0.5 mm to form one pattern depicted for a loading of exposure charge, one flux consisting of 20 beams applied over the width of 10 μm. In this Example, the depiction was conducted at an exposure charge of $8 \times 10^{-5}$ coulomb/cm$^2$.

In the third step, the electron-beam sensitive film thus depicted was subjected to plasma etching in an atmosphere of gaseous carbon tetrachloride within the same vacuum vessel. The etching was effected under the conditions of: discharge frequency of 13.56 MHz, discharge gas pressure of $1 \times 10^3$ Torr, discharge input power of 300 W and discharge duration of 15 minutes. In this way, the development of the depicted pattern was achieved so that the PMMA photoresistive film carrying the desired pattern was formed on the substrate.

EXAMPLE 2

In the first step, argon gas was passed at a partial pressure of 1.0 Torr into the same vacuum vessel as described in Example 1 and applied to a glow discharge at a discharge frequency of 13.56 MHz and an input power of 20 W. Then, vapors of methyl methacrylate were introduced at a partial pressure of 0.3 Torr into the afterglow region of the argon discharge. After a discharge duration of 15 minutes, a film of PMMA of 0.8 μm thick was formed on the surface of the substrate.

In the second step, the depiction with electron beams was carried out at an exposure charge of $4.8 \times 10^{-4}$ coulomb/cm$^2$ in the same manner as described in Example 1.

In the third step, the etching of the depicted film was performed for a discharge period of approx. 7 minutes under the same conditions as in the third step of Example 1.

EXAMPLE 3

Following the same procedure as described in the first and second steps of Example 1, except that vaporized ethylene was introduced at a partial pressure of 1.5 Torr in place of methyl methacrylate, a polyethylene film of 0.3 μm in thickness was formed on the surface of the substrate and then depicted with electron beams.

In the third step, the film on the substrate was heated to a temperature of 180° C. in the evacuated vessel under a pressure of 0.1 Torr to evaporate off the degraded parts of the polyethylene film. Thus, the photoresistive polyethylene film carrying the predetermined pattern was formed on the substrate.

What we claim is:

1. A dry lithographic process comprising the consecutive steps of:
   (i) introducing at least one ethylenically unsaturated monomer compound in the vapor form into a vacuum vessel where said monomer compound is, at least in part, excited in a plasma atmosphere and deposited onto the surface of a substrate located in the vacuum vessel to form a plasma-polymerized film on said substrate,
   (ii) exposing the film thus formed on the substrate to a controlled beam of electrons in conformity to the predetermined pattern to degrade the polymer in the exposed part of the film, and (iii) removing the degraded part of the polymer from the film by development in vapor phase etching atmosphere.

2. A process according to claim 1 in which the monomer compound is ethylene or especially methyl methacrylate.

3. A process according to claim 1 in which the monomer compound is introduced into the afterglow region of a flowing inert gas.

4. A process according to claim 1 in which the beam of electrons is applied to the plasma-polymerized film in conformity to the predetermined pattern which has been memorized by an electronic computer.

5. A process according to claim 1 in which the development is effected in the discharge condition with gaseous carbon tetrachloride.

6. A process according to claim 1 which is carried out in an apparatus of the type comprising a single vacuum vessel which is divided by partition walls into three compartments adapted to be individually evacuated and in which there is provided a movable substrate-supporting member which carries the substrate successively from the first compartment to the second and then the third compartments.

* * * * *